United States Patent [19]

Neidorff

[11] Patent Number: 5,066,869

[45] Date of Patent: Nov. 19, 1991

[54] RESET CIRCUIT WITH PNP SATURATION DETECTOR

[75] Inventor: Robert A. Neidorff, Bedford, N.H.

[73] Assignee: Unitrode Corporation, Lexington, Mass.

[21] Appl. No.: 506,465

[22] Filed: Apr. 9, 1990

[51] Int. Cl.⁵ .................... H03K 17/20; H03K 17/22; H03K 17/16; H03K 3/013

[52] U.S. Cl. ................................ 307/272.3; 307/300; 307/279; 307/594; 357/43; 357/44; 357/46

[58] Field of Search ..................... 307/272.3, 300, 303, 307/592, 594, 603, 279, 482.1; 357/43, 44, 46, 38

[56] References Cited

U.S. PATENT DOCUMENTS

| | | | |
|---|---|---|---|
| 3,676,714 | 7/1972 | Wensink et al. | 357/46 X |
| 4,021,687 | 5/1977 | Yoshimura | 357/44 X |
| 4,091,296 | 5/1978 | Suzuki et al. | 357/44 X |
| 4,130,827 | 12/1978 | D'Altroy et al. | 357/44 X |
| 4,463,369 | 7/1984 | Harford | 357/44 |

Primary Examiner—Stanley D. Miller
Assistant Examiner—David R. Bertelson
Attorney, Agent, or Firm—Weingarten, Schurgin, Gagnebin & Hayes

[57] ABSTRACT

A power supply reset circuit with a PNP transistor for detecting saturation of an NPN transistor and resetting a fault latch. The PNP and NPN transistors may be separate, discrete components. A preferred embodiment includes a vertical NPN transistor formed in a semiconductor substrate and includes a base, emitter and collector region. The functional, lateral PNP transistor is also fashioned in the semiconductor substrate and has a base region formed by the collector region of the NPN transistor, an emitter region formed by the base region of the NPN transistor, and a distinct, separate collector region disposed in selected proximity to the base and emitter region of the vertical NPN transistor, forming a saturation detector.

6 Claims, 3 Drawing Sheets

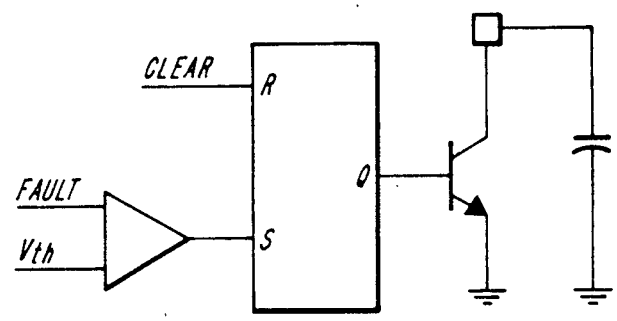
FIG. 1
(PRIOR ART)
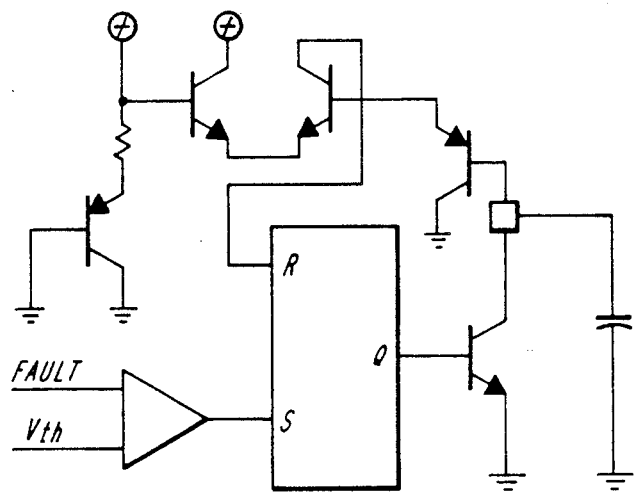
FIG. 2
(PRIOR ART)
FIG. 3
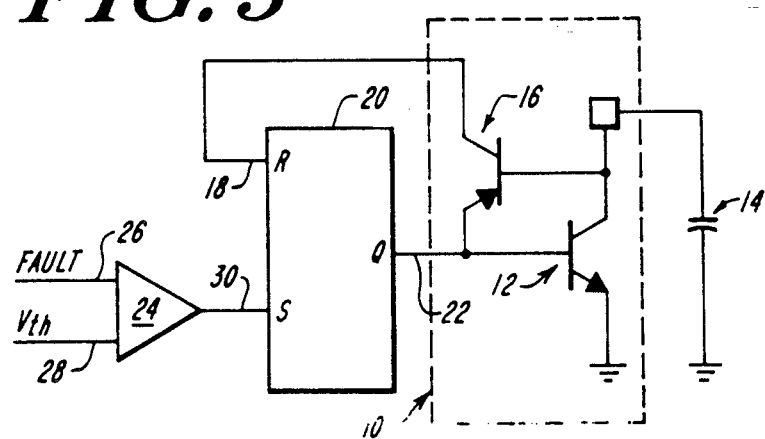

RESET CIRCUIT WITH PNP SATURATION DETECTOR

FIELD OF THE INVENTION

This invention relates to power supply circuits and in particular, to circuits for reapplying power supply voltage after a fault has been detected and reset.

BACKGROUND OF THE INVENTION

Power supplies generally include circuitry necessary for allowing the supply to slowly ramp up to its full voltage potential in order to reduce the inrush current demand on the power supply. Power supply circuitry is also provided for monitoring the supply voltage and for turning off the supply in event of a fault, such as overvoltage or excessive current draw. In the event of a fault, circuitry must also be provided for restarting the power supply after the fault has cleared.

Prior art softstart and fault reset circuitry is based on a fault signal discharging a capacitor and monitoring of the capacitor voltage. When the capacitor voltage has decreased below a predetermined threshold, the power supply voltage is reapplied. This design works well only when the fault signal is long enough to insure that the capacitor will fully discharge. In the case of large capacitors and short fault signals, however, the capacitor will not fully discharge and the power supply will restart from a voltage level above the desired restart voltage level.

Subsequent prior attempts at providing softstart circuitry include the addition of a latch, such as shown in FIG. 1, to control the capacitor discharge path and compel the user of such a device to externally reset the fault latch before restarting the power supply. Although functional, such a manual reset puts the timing burden onto the user.

An additional enhancement of prior art power supply softstart and reset circuitry is illustrated in FIG. 2 wherein a full NPN differential comparator is utilized to sense capacitor voltage and clear the fault latch automatically when the capacitor has discharged below a predetermined threshold. Although this circuit provides for automatic fault latch reset without user intervention, the circuit requires a large number of active and inactive circuit elements, increasing the size and cost of the circuit, which accordingly reduces circuit manufacturing yield and reliability.

SUMMARY OF THE INVENTION

A reset circuit with PNP saturation detector is disclosed including an NPN transistor having base, emitter and collector regions. The invention also includes a PNP transistor having base, emitter and collector regions, and energizable in response to saturation of the NPN transistor. Further included is a latch circuit element having set and reset input control ports and at least one output port. The reset input port is coupled to the collector region of the PNP transistor and the at least one output port is coupled to the base region of the NPN transistor and emitter region of the PNP transistor. The at least one output port of the latch circuit element is responsive to an input signal on the input port for energizing the NPN transistor, and responsive to the energization of the PNP transistor on the reset input port, for de-energizing the NPN transistor as a function of said PNP transistor detecting saturation of the NPN transistor.

In a preferred embodiment, the reset circuit according to the present invention includes a functional, lateral PNP transistor and a vertical NPN transistor formed on a single semiconductor substrate The vertical NPN transistor has a base, emitter, and collector regions. A functional lateral PNP transistor is also fashioned in the semiconductor substrate and has a base region formed by the collector region of the NPN transistor, an emitter region formed by the base region of the NPN transistor, and a distinct collector region located in selected proximity to the base and emitter regions of the NPN transistor, for providing a PNP saturation detector for detecting saturation of the NPN transistor.

In the preferred embodiment, the collector region of the vertical NPN transistor is formed of n+ material located within an n- epitaxial region. A p-diffusion region in the n-epitaxial region forms the base of the NPN transistor while an n+ region within the p-diffusion region provides the emitter region for the NPN transistor. The functional, lateral PNP transistor is formed by an additional p-diffusion region within the n- epitaxial region, in selected proximity to the base and emitter regions of the NPN transistor, for providing a PNP saturation detector and detecting saturation of the NPN transistor. The base and emitter portions of the functional lateral PNP transistor are formed by the collector and base regions of the NPN transistor respectively.

The preferred embodiment also includes a fault latch having set and reset inputs and at least one output coupled to the base of the NPN transistor. The output of the fault latch energizes the NPN transistor in response to an input signal on the set input port, and de-energizes the NPN transistor in response to a reset input signal. The preferred embodiment includes such a fault latch formed from a plurality of inverse active NPN transistors. Alternatively, the PNP saturation detector may be coupled to a single, inverse active NPN transistor which in turn is coupled to a standard, bi-polar fault latch.

DESCRIPTION OF THE DRAWINGS

These and other features of the present invention will better understood by reading the following detailed description, taken together with the drawings, wherein:

FIGS. 1 and 2 are schematic diagrams of prior art reset circuits;

FIG. 3 is a schematic diagram of the reset circuit according to the present invention;

DETAILED DESCRIPTION OF THE INVENTION

Figure 4:
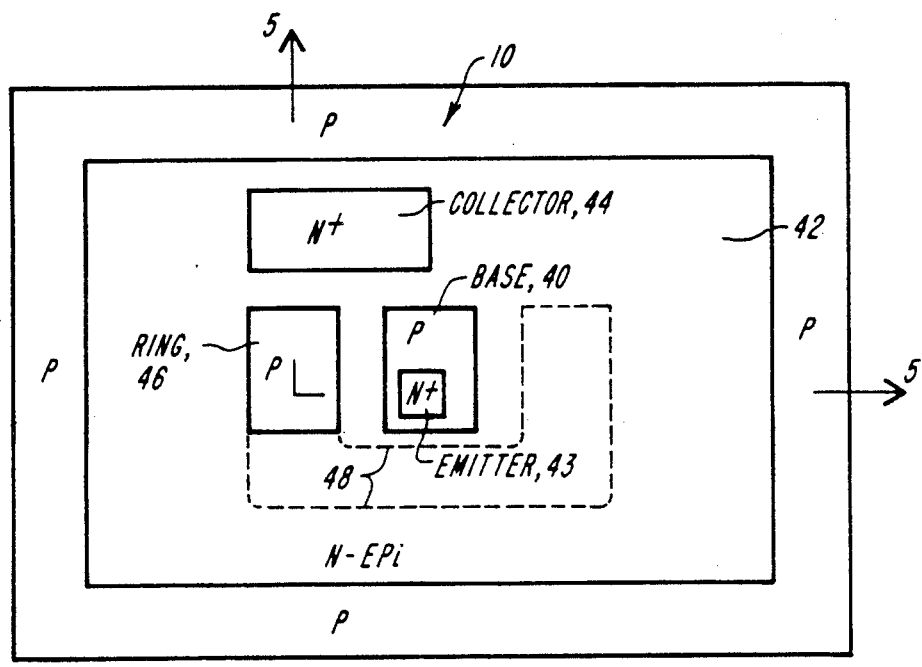
FIG. 4 is a schematic diagram of the topology of the circuit of the present invention.

The reset circuit with functional PNP saturation detector is illustrated in schematic diagram form in FIG. 3. Whenever a fault occurs within a power supply, such as an overvoltage condition or excess current draw, the supply provides a fault signal which exceeds a predetermined voltage level. When the fault signal voltage on input 26 of comparator 24 exceeds the selected voltage threshold on second input 28 of comparator 24, the comparator asserts an active signal on "set" input 30 of latch 20. An active signal on "set" input 30 causes the output 22 of latch 20 to energize transistor 12. Energization of transistor 12 serves to discharge the supply voltage stored on capacitor 14. As the voltage on capacitor 14 discharges, the collector-base voltage on transistor 12 decreases until finally the collector-base junction is forward biased. This is defined as the saturation point of NPN transistor 12. Forward biasing of the collector-base of NPN transistor 12 simultaneously results in the forward biasing of the emitter-base junction of PNP transistor 16, thereby energizing PNP transistor 16. Accordingly, transistor 16 serves to detect saturation of NPN transistor 12, thereby indicating that capacitor 14 has generally fully discharged.

When PNP transistor 16 is energized as a result of detecting the saturation of NPN transistor 12, it asserts a signal on reset input 18 of reset latch 20. If the fault signal is taken low, then asserting an input on reset port 18 causes output port 22 to assert a logic "0" on the base of NPN transistor 12 and the emitter of PNP transistor 16, thereby de-energizing both the NPN and PNP transistors. Both the NPN and PNP transistors may be provided as discrete components in which case it is desirable to ensure that the PNP transistor is a larger or high power device in relationship to the NPN transistor. The ensures that the $V_{BE}$ of the PNP transistor will be lower than the $V_{CB}$ of the NPN transistor to ensure that the PNP transistor will begin conducting before the NPN transistor fully saturates.

FIG. 4 illustrates the topology of circuit block 10 as implemented in a silicon substrate. As illustrated, NPN transistor 12 is formed by base 40, a P type material formed by a diffusion in n- epitaxial region 42. The emitter of NPN transistor 12 is formed by n+ region 43 which is located within P diffusion region 40. Collector region 42 formed of n-material and n+ collector contact region 44, complete NPN transistor 12.

Lateral PNP transistor 16 is formed utilizing n-epitaxial region 42 and n+contact region 44 as its base, P diffusion region 40 as its emitter, and an additional P diffusion region 46 as its collector. As previously stated, saturation of NPN transistor 12 is defined by the forward biasing of the collector-base junction of the transistor. Forward biasing these two regions serves to forward bias the emitter-base junction of PNP transistor 16, thereby energizing the transistor. The output from the collector 46 of the PNP saturation detector transistor can then be used to clear or reset a latch. The gain, or amount of current that collector region 46 is able to conduct may be adjusted by extending collector region 46 as shown by dash lines 48 which may partially or fully ring or encircle base emitter region 40-42.

Figure 5:
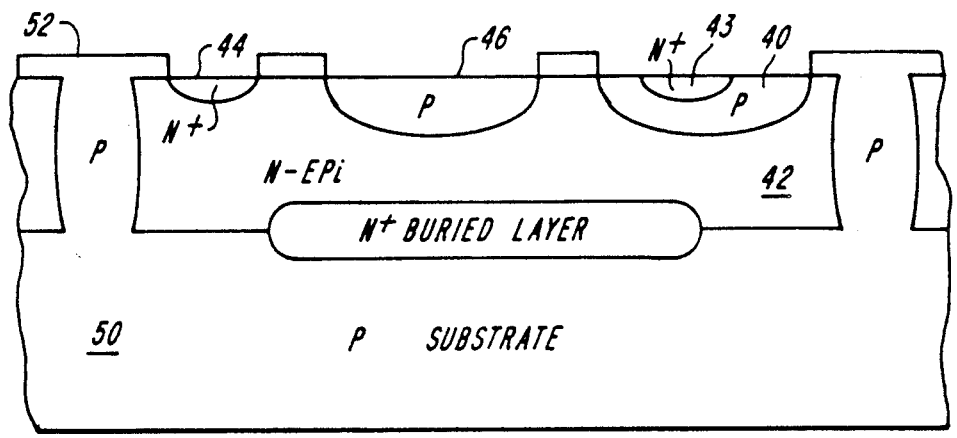
FIG. 5 is a cross-sectional view taken along lines 5—5 of FIG. 4.

Illustrated in cross section in FIG. 5, NPN transistor 12 is implemented by providing P diffusion region 40 in n-epitaxial layer 42. N+ region 43 provides the emitter of NPN transistor 12. N+ region 44 forms the collector contact of NPN transistor 12 and completes the NPN transistor. P diffusion region 46 forms the collector of PNP transistor 16 and senses saturation of NPN transistor 12 by sensing forward biasing of base region 40 and collector region 42 of NPN transistor 12. Substrate region 50 provides isolation of the circuit from other adjacent circuits. Oxide layer 52 is provided over the circuit substrate.

Figure 6:
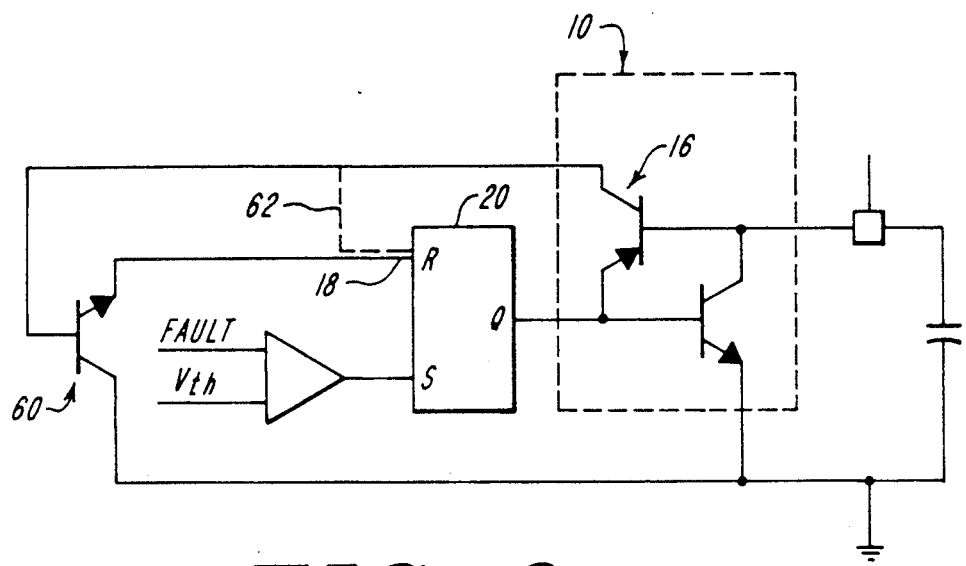
FIG. 6 is a schematic diagram of a preferred embodiment of the present invention.

Since the collector of PNP transistor 16 is better suited to driving an I²L logic gate, transistor 60, FIG. 6, is an upside-down or inverse active NPN transistor and may be provided to buffer the signal between PNP transistor 16 and reset input 18 of latch 20. Alternatively, latch 20 may be implemented utilizing upside-down or inverse active NPN logic gates in which case upsidedown NPN transistor 60 may be eliminated and the collector signal of PNP transistor 16 brought directly to reset input 18 by means of signal path 62.

Modifications and substitutions to the present invention by one of ordinary skill in the art are considered within the scope of the present invention and the claims which follow.

I claim:

1. A reset circuit including an NPN transistor with a PNP transistor forming a saturation detector, comprising:

an NPN transistor including base, emitter and collector regions;

a PNP transistor including base, emitter and collector regions, energizable in response to saturation of said NPN transistor; and a latch circuit element having set and reset input control ports and at least one output port, said reset input port coupled to the collector of said PNP transistor, and said at least one output port coupled to the base of said NPN transistor and emitter of said PNP transistor; and said at least one output port responsive to an input signal on said input port for energizing said NPN transistor, and responsive to the energization of said PNP transistor input on said reset input port, for de-energizing said NPN transistor as a function of said PNP transistor detecting saturation of said NPN transistor.

2. The circuit of claim 1 further including an inverse active NPN transistor having a base region coupled to the collector of said PNP transistor, an emitter region coupled to said reset input of said latch element, and a collector region coupled to the emitter region of said NPN transistor; and said inverse active NPN transistor operative to provide an input signal on said reset input port for de-energizing said NPN transistor as a function of said PNP transistor detecting saturation of said NPN transistor.

3. The circuit of claim 1 wherein the collector region of said NPN transistor is coupled to one end of a capacitor, and wherein the emitter region of said NPN transistor and a second end of said capacitor are coupled to signal ground; and wherein said NPN transistor is operative, when energized, for discharging voltage stored on said capacitor.

4. The circuit of claim 1 in which said latch circuit element is fashioned from a plurality of inverse active transistors.

5. The circuit of claim 1 wherein said NPN transistor and said PNP transistor are discrete components selected such that the PNP transistor is energized upon the saturation of said NPN transistor.

6. The circuit of claim 1 wherein said PNP transistor includes a functional, lateral PNP transistor having a base region formed by the collector of said NPN transistor, an emitter region formed by the base region of said NPN transistor and a collector region in selected proximity to the base and emitter regions of said NPN transistor.

* * * * *